(12) United States Patent
Roemer et al.

(10) Patent No.: US 7,358,769 B2
(45) Date of Patent: Apr. 15, 2008

(54) XOR CIRCUIT

(75) Inventors: Tanja Roemer, Munich (DE); Norbert Janssen, Munich (DE)

(73) Assignee: Infineon Technologies AG (DE)

( * ) Notice: Subject to any disclaimer, the term of this patent is extended or adjusted under 35 U.S.C. 154(b) by 66 days.

(21) Appl. No.: 11/361,322

(22) Filed: Feb. 23, 2006

(65) Prior Publication Data

US 2006/0202718 A1    Sep. 14, 2006

(30) Foreign Application Priority Data

Feb. 23, 2005  (DE) ............... 10 2005 008 367

(51) Int. Cl.
*G06F 7/50* (2006.01)
*H03K 19/21* (2006.01)

(52) U.S. Cl. ..................... 326/55; 326/93; 326/108
(58) Field of Classification Search ............ 326/52–55, 326/93–98, 113
See application file for complete search history.

(56) References Cited

U.S. PATENT DOCUMENTS

| 4,646,306 | A | * | 2/1987 | Davis et al. | ............. 714/801 |
| 5,399,921 | A |   | 3/1995 | Dobbelaere  |                      |
| 5,859,548 | A | * | 1/1999 | Kong        | ............. 326/113 |
| 6,803,793 | B2| * | 10/2004| Inoue       | ............. 326/95  |
| 6,847,789 | B2| * | 1/2005 | Savoj       | ............. 398/155 |
| 2002/0109530 | A1 | | 8/2002 | Inoue     |                      |

FOREIGN PATENT DOCUMENTS

| EP | 0 552 734 A2 | 1/1993 |
| JP | 2000188538 A | 7/2000 |

* cited by examiner

*Primary Examiner*—Rexford Barnie
*Assistant Examiner*—Crystal L Hammond
(74) *Attorney, Agent, or Firm*—Dickstein, Shapiro, LLP.

(57) ABSTRACT

An XOR circuit designed in dual rail includes four shunt transistors, wherein the shunt transistors are disposed to couple an input potential at a first input or a second input with an output.

6 Claims, 2 Drawing Sheets

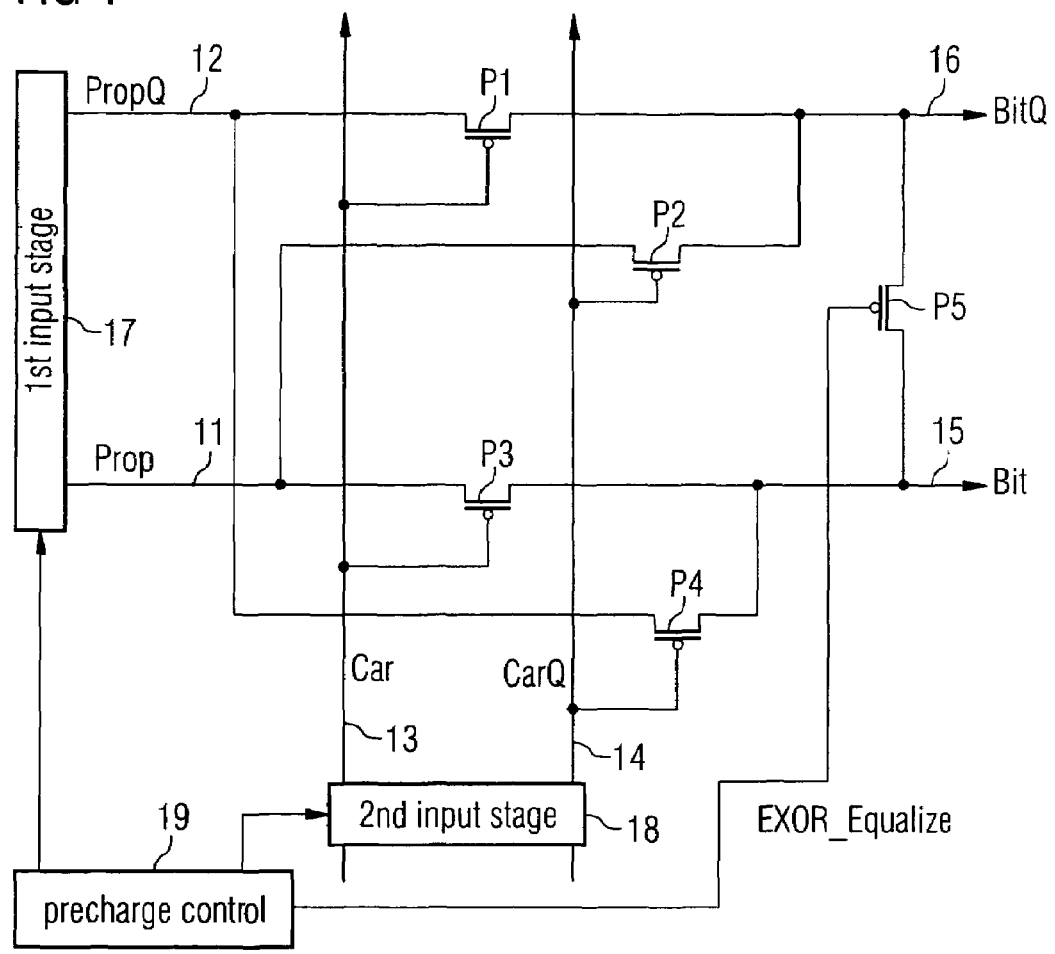

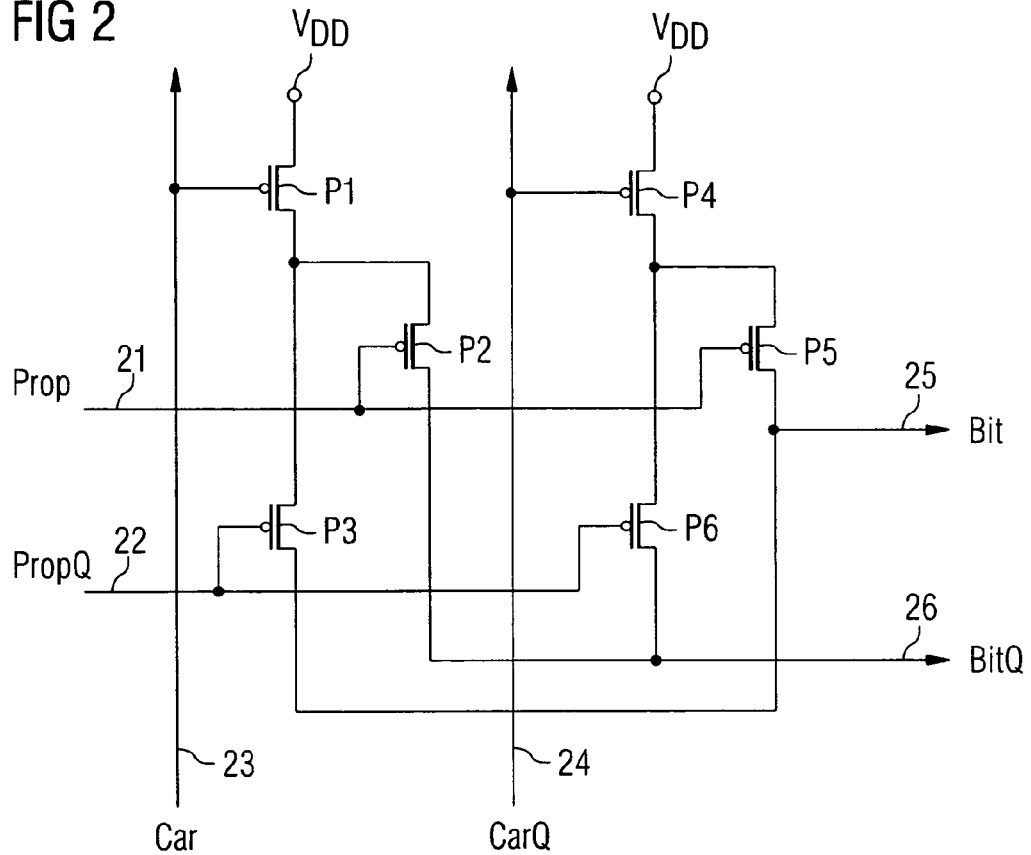

XOR CIRCUIT

CROSS-REFERENCE TO RELATED APPLICATION

This application claims priority from German Patent Application No. 102005008367.6, which was filed on Feb. 23, 2005 and is incorporated herein by reference in its entirety.

BACKGROUND OF THE INVENTION

1. Field of the Invention

The present invention relates to logic circuits and particularly to logic circuits in dual rail design.

2. Description of the Related Art

Dual rail circuits are particularly preferred for cryptographical applications, but also for other fast logic applications. Here, for every operand, both the value of the operand itself and the inverted value of the operand are provided and processed. Then, not only the calculated bit but also the inverted value of the calculated bit is obtained at the output side. Thereby, it is ensured that the current consumption is independent of whether the numbers to be processed are logic zeros or logic ones.

A higher security with such dual rail circuits is obtained when an evaluation mode or data mode always follows a preparation mode or precharge mode or predischarge mode. In the precharge mode, both the input and the inverted input are brought to the same high potential. In the predischarge mode, however, both the operand and the inverted operand are brought to the same low potential. Each time, when a data mode follows a precharge mode, it is ensured that always only one line changes from one mode to the next, which means at a transition from a preparation mode to an evaluation mode or data mode. Thereby, a current profile is obtained which is fully independent of the data to be processed.

XOR circuits are used in different situations. One application is in counters, wherein here an XOR-operation of a propagate signal Prop with a carry signal Car of a next-lower bit slice is required. FIG. 2 shows an existing XOR circuit for linking a propagate signal Prop and a carry signal Car to obtain a result. The circuit shown in FIG. 2 is also designed in dual rail technique and comprises four inputs 21, 22, 23, 24 and two outputs 25, 26. For implementing the XOR truth table, as illustrated in FIG. 3, for example, six transistors P1, P2, P3, P4, P5 and P6 are required in the known circuit. The circuit shown in FIG. 2 has as the characteristic that all four inputs 21 to 24 are guided to one gate of a PMOS transistor P1, P2, P3, P4, P5, P6, which means that none of the inputs has to be driven. Thus, for operating the XOR circuit shown in FIG. 2, only a very small driver is required on the side of the input operands.

However, it is a disadvantage of the circuit shown in FIG. 2, that when a precharge is performed, all transistors shown in FIG. 2 are non-conductive. This means that all inner nodes float. Thus, in the precharge state, neither the outputs 25 and 26 of the circuit shown in FIG. 2 nor the inner nodes between the individual transistors are driven.

If the circuit transits to the evaluation phase, it has the disadvantage that only one of the two paths is driven with a logic "1". With an unfavorable layout, where, for example, parasitic couplings into the precharge phase take place, this can cause an error function of the circuit.

If valid values are assigned to the inputs in the next evaluation phase, again, a Vdd path is connected to the output bit or the inverted output bit. Since residual charge from the previous cycle can be stored at the inner node of the XOR gate, and since residual charge can further also be stored at the output, effects can result, which again cause performance loss, shunt current and lacking operational reliability. Thus, for example, it can happen that a bit driven due to a residual charge present from a previous cycle, first has to fight the residual charge. During this, a shunt current flows and the circuit becomes slower than necessary. This effect can be significantly intensified by coupling capacitances, which can, in an extreme case, even have the effect that the residual charge "wins" and thus the result will be wrong.

DE 197 12 553 A1 discloses a charge recycling difference logic circuit and memory elements comprising this circuit. An nMOS pass transistor logic network comprising four nMOS transistors for implementing the XOR/XNOR function, is coupled to a precharge circuit, which will connect the output nodes when the clock is low, to bring both output nodes to a voltage equal to half of the difference between Vdd and Vss, and to disconnect the two output nodes from each other in the evaluation node, which takes place when the clock is high.

SUMMARY OF THE INVENTION

It is an object of the present invention to provide a more efficient and flexible XOR circuit.

The present invention provides an XOR circuit with a first input for a first operand, a second input for an inverted first operand, a third input for a second operand, a fourth output for an inverted second operand, a first output for an result operand and a second output for an inverted result operand, having: a first switch connected between the second input and the second output, wherein a control electrode of the first switch is connected to the third input; a second switch connected between the first input and the first output, wherein a control electrode of the second switch is connected to the fourth input; a third switch connected between the first input and the first output, wherein a control electrode of the third switch is connected to the third input; a fourth switch connected between the second input and the first output, wherein a control electrode of the fourth switch is connected to the fourth input; and a preparation means for alternately driving the inputs of the XOR circuit in a preparation mode and in a data mode, wherein the first input and the second input or the third input and the fourth input can be driven to the same potential in the preparation mode.

BRIEF DESCRIPTION OF THE DRAWINGS

These and other objects and features of the present invention will become clear from the following description taken in conjunction with the accompanying drawings, in which:

FIG. 1 is an inventive XOR circuit according to a preferred embodiment;

FIG. 2 is an existing XOR circuit; and

FIG. 3 is an XOR truth table for a dual rail XOR gate.

DESCRIPTION OF THE PREFERRED EMBODIMENTS

The present invention is based on the knowledge that for reducing the internal nodes, which are floating in the precharge state, the premise that the XOR circuit has to be structured such that the inputs are no longer loaded, which means only strike gates of transistors within the XOR circuit, has to be abandoned. In other words, the speed of the XOR circuit and also the operational reliability of the circuit are improved by reducing the number of internal nodes which are not driven in the precharge state, which means are floating. In the inventive circuit only the outputs are floating in the precharge state, depending on the circuits downstream of the XOR circuit. On the other hand, no more input nodes exist, which are undefined in the precharge state. Thus, it is ensured that no spurious residual charges have to be overcome in a precharge state to calculate a bit or an inverted bit.

Further, the inventive XOR circuit is characterized in that it requires less area. Thus, the inventive XOR circuit only has four "calculating transistors" and an optional equalize transistor, which is a reduction by one third or one sixth, respectively, of the required area compared to the six transistors of the known circuit. Particularly with long number calculating units, which require many bit slices, the savings of chip area per XOR gate leads to a significant saved area with regard to the whole chip.

Further, the inventive circuit is characterized by a performance gain, by a reduction of shunt current and an increase of operational reliability. Further, it is accomplished that the current profile is independent of the result bit, by preferably installing the equalize transistor, which short-circuits the two outputs in the precharge state, whereby possibly remaining residual charges due to the previous evaluation mode are equally distributed to both outputs and can thus be overcome easier in the next evaluation mode.

FIG. 1 shows an inventive XOR circuit. The circuit comprises a first input 11, a second input 12, a third input 13 and a fourth input 14. The non-inverted version of the first operand is applied to the first input 11, which means in the present example the propagate parameter of the previous look ahead circuit. The inverted value of the propagated parameter is applied to the second input 12. A non-inverted version of the carry bit Car (Car=carry) is applied to the third input 13. The inverted version of the carry bit (CarQ) is applied to the fourth input 14. Further, the XOR circuit has two outputs 15 and 16, wherein the non-inverted bit is applied to the output 15 and wherein the inverted result bit is obtained at the output 16. Further, the inventive circuit comprises four switches P1, P2, P3, P4, which are all formed as PMOS transistors in the preferred embodiment of the present invention, so that they together operate with a precharge operation of all input operands at the four inputs. If a predischarge operation were chosen, the four switches should be designed as NMOS transistors. Further, optionally, an equalize transistor P5 is provided, which is connected between the first output 15 and the second output 16 to connect the two outputs 15 and 16 in the preparation mode, which means the precharge mode or predischarge mode, respectively, while the transistor P5 is non-conductive in the evaluation mode or data mode, so that the two outputs 15 and 16 are not short-circuited. Both the equalize transistor P5 and a first input stage 17 and a second input stage 18 are controlled by precharge control 19, which is formed to bring all input values at the four inputs 11 to 14 to the same potential in the preparation mode.

The first input stage is further formed to drive the first input 11 or the second input 12, respectively, in the evaluation mode, so that a safe result potential is applied to the two outputs 15 or 16, respectively. On the other hand, the second input stage does not have to be designed so powerful, since the second input operand and the inverted second input operand are only connected to gates of the calculating transistors and thus do not have to drive output potentials.

Specifically, a first switch P1 is connected between the second input 12 and the second output 16. The control electrode of the first switch P1 is connected to the third input 13 of the XOR circuit.

Further, a second switch P2 is connected between the first input 11 and the second output 16. The control electrode of the second switch is connected to the fourth input of the XOR circuit.

Further, a third switch P3 is connected between the first input 11 and the first output 15, wherein a control electrode of the third switch P3 is again coupled to the third input of the XOR circuit.

Finally, a fourth switch P4 is connected between the second input 12 and the first output 15, wherein a control electrode of the fourth switch P4 is connected to the fourth input 14 of the XOR circuit.

In the following, the advantages of the inventive concept compared to the existing circuit shown in FIG. 2 will be discussed again.

In FIG. 2, a path is driven to "1". This means that the potential Vdd is either connected to the first output 25 or the second output 26. The other output is not driven.

If the precharge mode is entered, as in the circuit shown in FIG. 2, the charge cannot leak off when Vdd is decoupled from the circuit. The same thus lags and obstructs a recharge in the next evaluation cycle. Due to the residual charge by the history, a path in the circuit shown in FIG. 2 is charged to a logic state "1".

According to the invention, this disadvantage is overcome by driving an output path to a logic high state, which means, for example, Vdd, in the evaluation mode, while the other path is only driven to the threshold voltage Vth due to the residual charge by the history. Since the threshold voltage Vth is already significantly lower than the voltage Vdd, an improvement of the circuit is achieved without providing the equalize transistor, since the residual charge that has to be overcome when changing from a precharge mode to an evaluation mode, is significantly smaller than the residual charge in the circuit shown in FIG. 2.

In order to improve the inventive circuit further, it is further preferred to provide the equalize transistor P5. If a circuit, which does not connect the two outputs 15 and 16 to a predetermined potential in the precharge phase, follows the XOR circuit, these outputs 15 and 16 are still floating. This means that due to the history a charge is present at one output, while at the other output no charge is present due to the history. Thus, it has been found out that the distribution of the charge at one output to two outputs can cause an acceleration and improved operational reliability of the circuit, since then only half the residual charge has to be "overcome" in the next evaluation cycle.

Since the input of the control transistor is connected to the precharge control signal of the surrounding circuit, the potential of the two outputs 15 and 16 is balanced out and is then about 0.3 to 0.7-fold, depending on technology and layout. The outputs thus become more insensitive against couplings via parasitic capacitances.

Due to the arrangements of the shunt transistors P1 to P4, it is further achieved that during the evaluation both outputs 15 and 16 are driven, as has been explained. One output is driven with a logic "1", and the other output is driven with Vss minus Vthp. This also increases the robustness of the circuit.

The inventive circuit could also be used in static logic, when the transistor P5 is not provided or when its output is connected to a logic "1" in a fixed way.

Thus, the inventive circuit shows a higher robustness both during the precharge phase and during the evaluation phase and further comprises one transistor less compared to the circuit shown in FIG. 2, which leads to significant overall chip area savings, particularly in long number calculating units with many bit slices.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An XOR circuit comprising:
   a first input for a first operand;
   a second input for an inverted first operand;
   a third input for a second operand;
   a fourth input for an inverted second operand;
   a first output for a result operand;
   a second output for an inverted result operand;
   a first switch connected between the second input and the second output, wherein a control electrode of the first switch is connected to the third input;
   a second switch connected between the first input and the second output, wherein a control electrode of the second switch is connected to the fourth input;
   a third switch connected between the first input and the first output, wherein a control electrode of the third switch is connected to the third input;
   a fourth switch connected between the second input and the first output, wherein a control electrode of the fourth switch is connected to the fourth input; and
   a preparer for alternately driving the inputs of the XOR circuit in a preparation mode and in a data mode, wherein the first input and the second input are driven to the same potential or the third input and the fourth input are driven to the same potential in the preparation mode.

2. The XOR circuit according to claim 1, further comprising:
   an equalize transistor connected between the first output and the second output, wherein the equalize transistor is formed to connect the first output and the second output in a preparation mode, and to disconnect the first output from the second output in a data mode.

3. The XOR circuit according to claim 1, wherein the switches are designed as transistors.

4. The XOR circuit according to claim 3, wherein the switches are formed as PMOS transistors, and wherein the preparer is formed for a precharge operation to drive both the first input and the second input as well as the third input and the fourth input to a high potential in the preparation mode following the data mode, or
   wherein the switches are formed as NMOS transistors, and wherein the preparer is formed for a predischarge operation to drive both the first input and the second input as well as the third input and the fourth input to a low potential in the preparation mode following the data mode.

5. The XOR circuit according to claim 1, further comprising:
   a first input stage for driving the first input and the second input, wherein the first input stage is formed to provide sufficient current so that the first output or the second output can be maintained at a stable potential in a data mode.

6. An XOR circuit comprising:
   a first input for a first operand;
   a second input for an inverted first operand;
   a third input for a second operand;
   a fourth input for an inverted second operand;
   a first output for a result operand;
   a second output for an inverted result operand;
   a first switch connected between the second input and the second output, wherein a control electrode of the first switch is connected to the third input;
   a second switch connected between the first input and the second output, wherein a control electrode of the second switch is connected to the fourth input;
   a third switch connected between the first input and the first output, wherein a control electrode of the third switch is connected to the third input;
   a fourth switch connected between the second input and the first output, wherein a control electrode of the fourth switch is connected to the fourth input; and
   a preparer for alternately driving the inputs of the XOR circuit in a preparation mode and in a data mode, wherein the first input and the second input are driven to the same potential or the third input and the fourth input are driven to the same potential in the preparation mode.

* * * * *